United States Patent [19]

Okazawa

[11] Patent Number: 4,584,760
[45] Date of Patent: Apr. 29, 1986

[54] METHOD OF MANUFACTURING A SEMICONDUCTOR DEVICE HAVING A POLYCRYSTALLINE SILICON LAYER

[75] Inventor: Takeshi Okazawa, Tokyo, Japan

[73] Assignee: NEC Corporation, Tokyo, Japan

[21] Appl. No.: 624,733

[22] Filed: Jun. 26, 1984

[30] Foreign Application Priority Data

Jun. 27, 1983 [JP] Japan ................................ 58-115523

[51] Int. Cl.⁴ .......................................... H01L 21/283
[52] U.S. Cl. ......................................... 29/571; 427/85;
427/86; 427/93; 29/576 R
[58] Field of Search ................ 29/571; 148/DIG. 25,
148/DIG. 122, 1.5; 427/85, 86; 357/59, 67 S,
71 S

[56] References Cited

U.S. PATENT DOCUMENTS

| | | | |
|---|---|---|---|
| 4,128,670 | 12/1978 | Gaensslen | 427/86 |
| 4,143,178 | 3/1979 | Harada et al. | 427/85 |
| 4,146,906 | 3/1979 | Miyata et al. | 357/59 |
| 4,229,502 | 10/1980 | Wu et al. | 428/446 |
| 4,309,224 | 1/1982 | Shibata | 148/1.5 |
| 4,329,706 | 5/1982 | Crowder et al. | 357/71 |
| 4,373,251 | 2/1983 | Wilting | 29/571 |
| 4,471,524 | 9/1984 | Kinsblon et al. | 29/571 |
| 4,516,147 | 5/1985 | Komatsu et al. | 357/59 |
| 4,541,002 | 9/1985 | Shimada | 357/51 |

*Primary Examiner*—Brian E. Hearn
*Assistant Examiner*—T. Quach
*Attorney, Agent, or Firm*—Burns, Doane, Swecker and Mathis

[57] ABSTRACT

A semiconductor device is disclosed which includes an electrode or wiring layer having a polycrystalline silicon layer formed on an insulating film and a metal silicide layer formed thereon for reduction in electrical resistance. In order to prevent the metal silicide layer from diffusing into the polycrystalline silicon layer to finally reach the interface with the insulating film through various high-temperature heat treatment processes, the impurity concentration of the polycrystalline silicon layer is made different in the depthwise direction such that the concentration is higher at the lower part in contiguous with the insulating film than the upper part. With this structure, the diffusion of the metal silicide going to approach the insulating film is blocked by the presence of the lower part of high impurity concentration.

3 Claims, 16 Drawing Figures

METHOD OF MANUFACTURING A SEMICONDUCTOR DEVICE HAVING A POLYCRYSTALLINE SILICON LAYER

BACKGROUND OF THE INVENTION

The present invention relates to a semiconductor device having a polycrystalline silicon layer to be used as a gate electrode or wiring layer and a method of manufacturing the same, and more particularly to a semiconductor device, in which the upper part of the polycrystalline silicon layer is formed of a compound with metals (hereinafter referred to as metal silicide) for reduction in electrical resistance, and a method of manufacturing the same.

A semiconductor device in which a polycrystalline silicon layer is employed as a gate electrode of an insulated gate field effect transistor (hereinafter referred to as IGFET) and a wiring layer connected thereto is widely used. However, such a device gives rise a problem that the polycrystalline silicon layer has a high electrical resistance. In a semiconductor memory device, for example, when a word line extending in one direction is made of a polycrystalline silicon layer, a portion on a gate insulating film is used as a gate electrode of IGFET, and a portion on a field insulating film is used as a wiring layer. Such a word line will not have low electrical resistance at a desired level. To solve this problem, there has been proposed a technique in which metal silicide is formed in the upper part of a polycrystalline silicon layer. According to this technique in the prior art, however, the metal silicide layer is possible to diffuse into the polycrystalline silicon layer and finally to reach the interface with a insulating film such as a gate insulating film due to various high-temperature heat treatment process carried out after forming of the metal silicide layer which are essential in manufacturing the semiconductor device. This phenomenon is resulted from the reason that the heat treatment at high temperature activates metal atoms and silicon atoms both forming the metal silicide layer, thus collapsing the two-layer structure consisting of a metal silicide layer and a polycrystalline silicon layer which was completely maintained initially after forming of the metal silicide layer.

If the metal silicide layer reaches the interface with the gate insulating film, IGFET would have a remarkable influence in its electrical characteristics. Namely, IGFET is operated by controlling the electric field applied to the channel region so as to determine the amount of current flowing therethrough. Whereas, if a metal silicide layer in the gate electrode is attached on the gate insulating film, the precise control for the electric field in the channel region cannot be realized. Therefore, electrical characteristics of IGFET are unavoidably fluctuated to a large extent. For example, more specifically, enhancement type IGFET will be subjected to large fluctuations in the threshold voltage for forming of the inversion layer.

SUMMARY OF THE INVENTION

It is, therefore, one object of the present invention to provide a semiconductor device having a stable electrode or wiring layer which includes a polycrystalline silicon layer and a metal silicide layer on the polycrystalline silicon layer.

Another object of the present invention is to provide IGFET having a gate electrode which exhibits a low electrical resistance value and has stabilized electrical characteristics.

Still another object of the present invention is to provide a method of manufacturing a semiconductor device, which is effective of forming such a polycrystalline silicon layer as making a metal silicide layer formed at the upper part thereof hard to diffuse into the interior due to high-temperature heat treatment.

According to one feature of the present invention, there is provided a semiconductor device comprising an insulating film provided on a major surface of a semiconductor substrate, and an electrode or wiring layer provided on the insulating film, the electrode or wiring layer including a polycrystalline silicon layer formed on the insulating film and a metal silicide layer formed on the polycrystalline silicon layer, the impurity concentration of the polycrystalline silicon layer being distributed unevenly in the depthwise direction such that it is higher, favorably not less than $10^{21}$ cm$^{-3}$ in the interfacial portion of the polycrystalline silicon layer in contiguous with the insulating film than in an upper portion thereof remoted from the interfacial portion. The electrode and the insulating film may serves as a gate electrode and a gate insulating film of IGFET, respectively.

According to another feature of the present invention, there is provided a semiconductor device comprising a semiconductor substrate of one conductivity type, a field insulating film selectively formed on one major surface of the semiconductor substrate, an active region of the semiconductor substrate adjacent to the field insulating film, a gate insulating film formed on the active region for an insulated gate field effect transistor, a polycrystalline silicon layer formed on the gate insulating film and extending on the field insulating film, and a metal silicide layer formed on the polycrystalline silicon layer, the impurity concentration of the polycrystalline silicon layer being so distributed in the depthwise direction as to be higher in the lower part thereof in contiguous with the gate insulating film and the field insulating film than in the part thereof locating at a higher level.

The impurity concentration in the lower part of the polycrystalline silicon near or contiguous with the insulating film is favorably in a range of $10^{21}$ to $10^{23}$ cm$^{-3}$. When the impurity concentration is not less than $10^{21}$ cm$^{-3}$, it is considered that the diffusion of the metal silicide layer within the polycrystalline silicon will be practically blocked by the lower part, and therefore the metal silicide would not reach near the insulating film. On the other hand, from the standpoint of practical manufacture, the upper limit of impurity density contained in polycrystalline silicon is usually about $10^{23}$ cm$^{-3}$.

According to another aspect of the invention, there is provided a method of manufacturing a semiconductor device comprising the steps of forming an insulating film on a semiconductor substrate, forming a first polycrystalline silicon film on the surface of the insulating film, forming a second polycrystalline silicon films having lower impurity concentration than the first polycrystalline silicon film on the surface of the first polycrystalline silicon film, patterning both the first and second polycrystalline silicon films into a predetermined shape, forming a metal film on the second polycrystalline silicon film, and reacting the metal film and the second polycrystalline silicon film to form a metal silicide layer.

Impurities in the first and second polycrystalline silicon films may be contained at the time of producing these films, or may be introduced into the respective films by a diffusion method, ion implantation, etc. after forming thereof. Impurity concentration of the first polycrystalline silicon film is favorably in a range of $10^{21}$ to $10^{23}$ cm$^{-3}$ from the reason as stated above. On the other hand, the second polycrystalline silicon film is required to have the impurity concentration less than $10^{21}$ cm$^{-3}$ because it must form metal silicide. Meanwhile, impurity concentration of the second polycrystalline silicon film is favorably not less than $10^{17}$ cm$^{-3}$. This is resulted from the reason that, if the impurity concentration is too low, an etching time is prolonged at the time of patterning, and that the reaction in the forming process of the metal silicide layer becomes too quick to control precisely. Further, as impurities contained in the polycrystalline silicon layer there can be used arsenic, phosphorous, boron, etc. which are employed in general semiconductor devices and any of which can provide the nearly same effect. On the other hand, the metal for use in forming metal silicide may be of platinum, titanium, chromium, tantalum, molybdenum, tungsten, palladium, cobalt, etc.

DESCRIPTION OF THE PRIOR ART

Figure 1A:
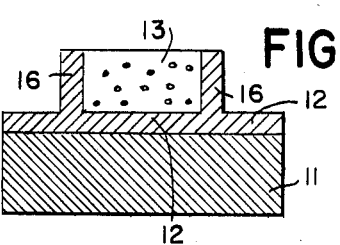
FIGS. 1A to 1D are cross-sectional views showing the process of a prior art method for forming a metal silicide layer in a polycrystalline silicon layer in sequence.
Figure 1B:
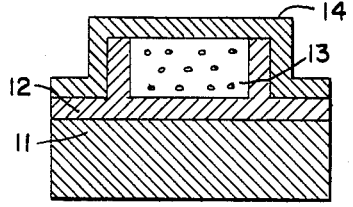
Figure 1C:
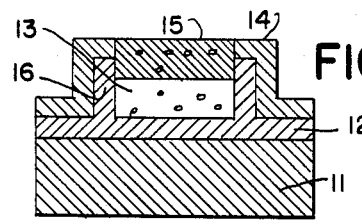
Figure 1D:
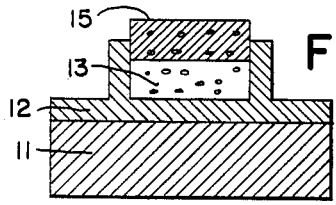

As shown in FIG. 1A, a silicon oxide film 12 of about 500 Å thickness is formed on a major surface of a monocrystalline silicon substrate 11 through, e.g., thermal oxidation. The film 12 serves as a gate oxide film of IGFET, for instance. A polycrystalline silicon film of one conductivity type in thickness of 5000 Å is deposited on the surface of the silicon oxide film 12, and by patterning the polycrystalline silicon film a patterned polycrystalline silicon layer 13 such as a gate electrode of IGFET is formed. Next, the silicon layer is subjected to thermal oxidation to coat its side faces with a silicon oxide film 16 in thickness of about 1000 Å. The polycrystalline silicon contains therein phosphorous as an impurity. Phosphorous concentration is usually in a range of $10^{17}$ to $10^{20}$ cm$^{-3}$ and substantially uniformly distributed throughout the polycrystalline layer. In other words, impurity concentration of the polycrystalline silicon layer 13 is substantially constant in the depthwise direction. Next, as shown in FIG. 1B, a metal layer 14 such as platinum or titanium is coated to cover at least the polycrystalline silicon layer 13. Subsequently, it is subjected to appropriate heat treatment so that metal atoms react with silicon atoms only in a portion of the metal layer 14 which is contiguous with the polycrystalline silicon 13, to growth a metal silicide layer 15. At this time, another portion of the metal layer 14 on the silicon oxide films remains in non-reacted state (FIG. 1C). Then, the non-reacted portion of the metal layer 14 contiguous with the silicon oxide films 12, 16 is removed away by etching using aqua regia or hydrogen peroxide solution. As a result, metal silicide layer 15 can be formed only on the polycrystalline silicon layer 13 (FIG. 1D). This method has a great advantage that a metal silicide layer can be formed on a polycrystalline silicon layer in a self-alignment fashion without using a special etching method, but gives rise the problem as follows.

Figure 2A:
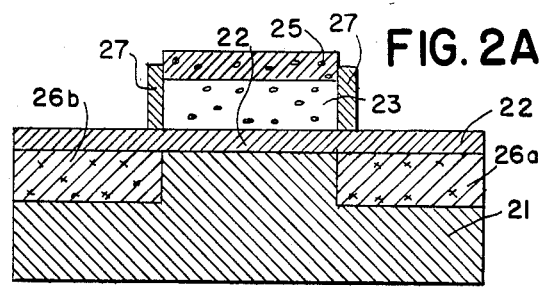
FIGS. 2A and 2B are cross-sectional views of IGFET for explaining the problem in the prior art.

FIG. 2A shows a section of the structure of IGFET which was manufactured using the method of forming a metal silicide layer shown in FIG. 1.

Figure 2B:
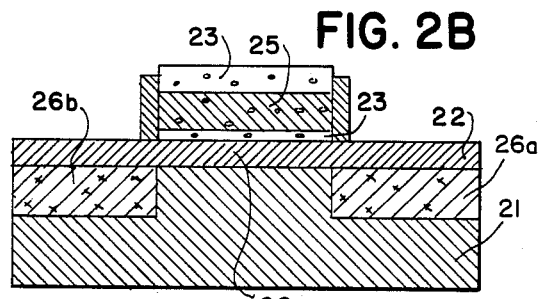

Referring to FIG. 2A, a gate insulating film 22 made of silicon oxide and having a thickness of about 500 Å is formed on a monocrystalline silicon substrate 21 of one conductivity type, e.g., P-type, a polycrystalline silicon layer 23 having substantially uniform impurity density in a range of $10^{17}$ to $10^{20}$ cm$^{-3}$ is formed thereon, and silicon oxide films 27 are provided on both sides of silicon layer 23. A metal silicide layer 25 is then formed on the polycrystalline silicon layer 23. Thus, a gate electrode is constituted by the polycrystalline silicon layer 23 and the metal silicide layer 25. With this gate electrode being used as a mask, an impurity of the other conductivity type, e.g., N-type, is implanted into the semiconductor substrate and then subjected to activation processing so as to form both source region 26a and drain region 26b of N-type. In case of forming the metal silicide layer in the gate electrode using the known technique as mentioned above, the polycrystalline silicon layer and the metal silicide layer have a two-layer structure as shown in FIG. 2A initially after forming thereof in point of not only physical structure but also electrical characteristics. However, such a two-layer structure is not necessarily stable and liable to collapse by various reasons, particularly a variety of high-temperature heat treatments carried out in the subsequent processes. When the two-layer structure is collapsed, the metal silicide layer 25 diffuses into the polycrystalline silicon layer 23, as shown in FIG. 2B, and finally may reach the interface with the gate insulating film 22.

DESCRIPTION OF EMBODIMENT

Figure 3A:
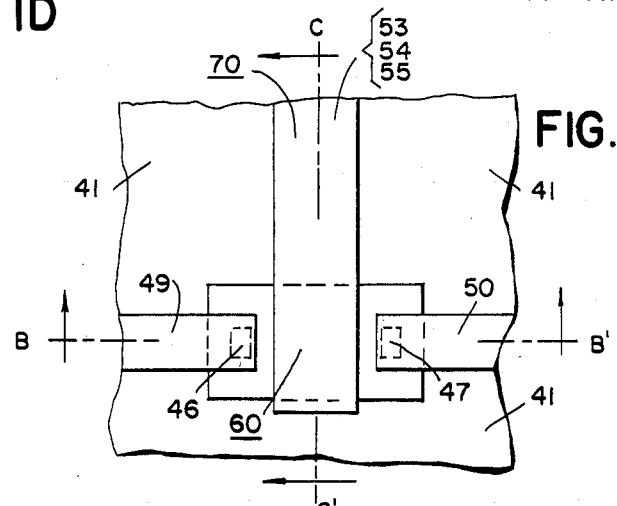
FIG. 3A is a top plan view showing an embodiment of the present invention.
Figure 3B:
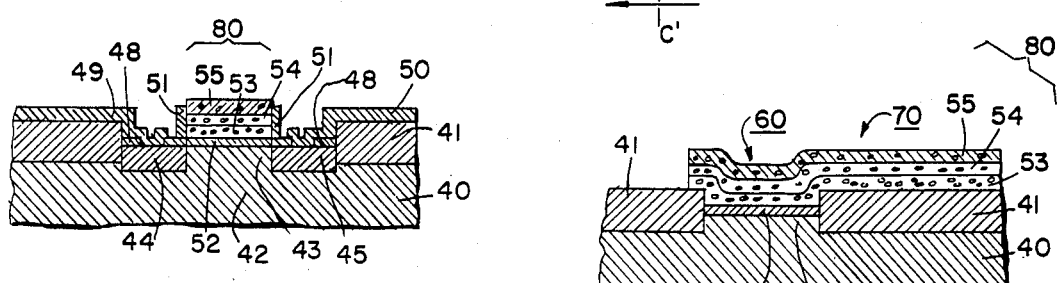
FIGS. 3B and 3C are cross-sectional views taken along the lines B—B' and C—C' in FIG. 3A and as viewed in the direction of arrows, respectively.
Figure 3C:
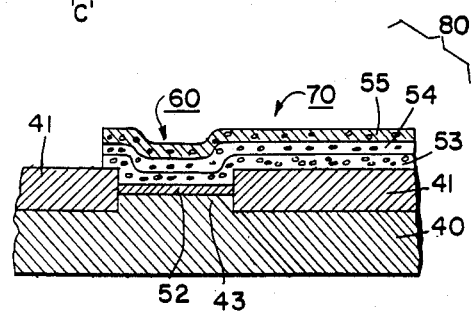

Referring to FIGS. 3A to 3C, a thick field silicon oxide film 41 is selectively formed on one major plane of one conductivity type, e.g., P-type, semiconductor substrate 40, and IGFET is provided in an active region 42 adjacent to the field oxide film 41. More specifically, both source region 45 and drain region 44 of the opposite conductivity, e.g., N-type, are provided. These regions are so formed that, with a later-described gate electrode and thermal oxidation films on its side faces being used as a mask, an impurity of the opposite conductivity type is introduced into the semiconductor substrate using, e.g., an ion implantation and then subjected to activation processing to active ions and to coincide substantially the edges of the regions with those of the gate electrode in a plane. A source wiring layer 50 is connected to the source region 45 through a contact opening 47 formed in an insulating film 48 and extends on the field silicon oxide film 41. Likewise, a drain wiring layer 49 is connected to the drain region 44 through a contact hole 46 formed in the insulating film 48 and extends on the field silicon oxide film 41.

On a channel region 43 between the source region and the drain region there is formed a gate insulating film 52 made of thermal oxidation silicon and having a thickness of about 500 Å. A double-layer comprising a polycrystalline silicon layer 80 and a metal silicide layer 55 of a compound of silicon and metal such as platinum or titanium is formed on the gate insulating film 52 and on the field oxidation film 41. In the double-layer, the portion above the gate insulating film 52 serves as a gate electrode 60, and the portion above the field oxidation film 41 serves as a gate wiring layer 70. It is apparent from the figures that these portions are formed continuously in a uniform shape. Further, the gate electrode is coated at both side faces thereof with a silicon oxide film 51 of about 1000 Å which is formed through thermal oxidation effected after patterning the polycrystalline silicon layer.

The present invention is featured in that impurity concentration in the polycrystalline silicon layer 80 is distributed unevenly in the depthwise direction. More specifically, the impurity density is increased downward from above. A lower film 53 of the polycrystalline silicon layer 80 has high impurity concentration of not less than $10^{21}$ cm$^{-3}$, favorably in a range of $10^{21}$ to $10^{23}$ cm$^{-3}$ and has a thickness of 1000 to 2000 Å. On the other hand, an upper film 54 in the polycrystalline silicon layer 80 has lower impurity concentration than the lower film. It should be noted that, although the boundary between the upper and lower films 54, 53 is denoted by a solid line in the figures, the impurity concentration is not discrete at that boundary but continuously changed as a consequence of heat treatment in practice.

Anyway, the polycrystalline silicon layer 80 includes at its lower part the film 53 which has the higher concentration of impurity, such as arsenic, phosphorous or boron, not less than $10^{21}$ cm$^{-3}$ and which has a thickness of 1000 to 2000 Å. Accordingly, even if the metal silicide 55 diffuses into the polycrystalline silicon layer 80 in various heat treatment processes after forming of the metal silicide 55, advance of the diffusion is essentially stopped by the presence of the high-concentration film 53 serving as a blocking film. As a result, the metal silicide will not reach near the gate insulating film 52, and there can be obtained IGFET which ensures stable operation.

Hereinafter, an embodiment of manufacture according to the present invention will be described with reference to FIG. 4. It is to be noted that FIG. 4 shows only the part of the gate electrode.

Figure 4A:
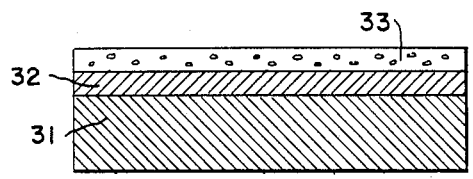
FIGS. 4A to 4G are cross-sectional views showing the process of a part of manufacturing an embodiment of the present invention in sequence.
Figure 4B:
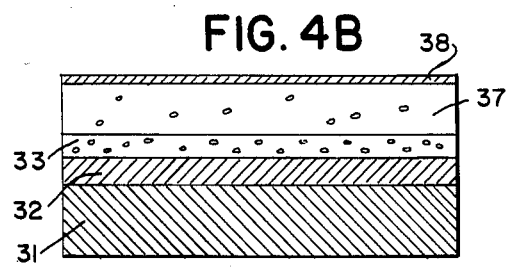
Figure 4E:
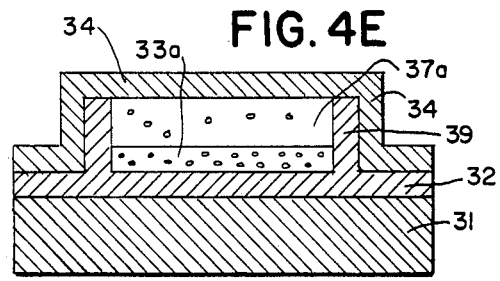
Figure 4C:
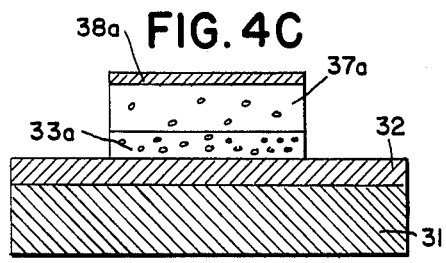
Figure 4F:
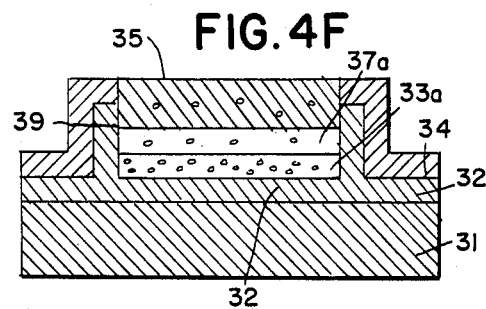
Figure 4D:
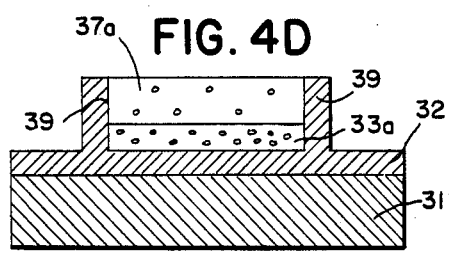
Figure 4G:
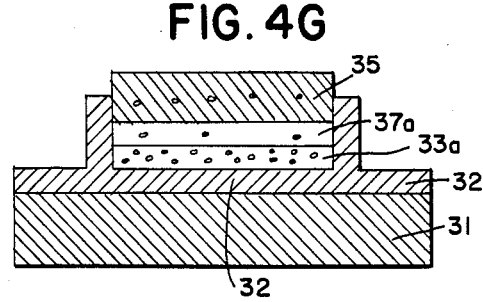

As shown from FIG. 4A, a gate insulating film 32 made of silicon oxide in thickness of about 500 Å is formed on a major surface of monocrystalline silicon substrate 31 of one conductivity type by using, e.g., a thermal oxidation method. A first polycrystalline silicon film 33 in thickness of 1500 Å is then formed on the gate insulating film 32 in contiguous therewith. Next, an impurity, e.g., phosphorous, is introduced into the first polycrystalline silicon film 33 by using any desired known method such as ion implantation or thermal diffusion, and the impurity concentration in the film 33 becomes about $10^{22}$ cm$^{-3}$. Such a high impurity concentration silicon film would hardly react with a metal to form a metal silicide layer. Namely, a forming speed of the metal silicide layer is usually strongly dependent on the impurity concentration and tends to become smaller as the impurity concentration is increased. Thus, it is understood that, when the impurity concentration exceeds a certain level, forming of a metal silicide layer in that region is practically negligible. Next, as shown in FIG. 4B, a second polycrystalline silicon film 37 having a thickness of 3500 Å and impurity concentration of $10^{18}$ cm$^{-3}$ is formed on the first polycrystalline silicon film 33. Impurity concentration of the second polycrystalline silicon film is selected to $10^{21}$ cm$^{-3}$ but greater than $10^{17}$ cm$^{-3}$ be smaller than $10^{21}$ cm$^{-3}$ but greater than $10^{17}$ cm$^{-3}$. Next, a film 38 such as a silicon nitride film, which can be used as a mask during thermal oxidation of silicon, is formed thereon. Next, as shown in FIG. 4C, the known etching technique is used to etch the silicon nitride film 38, the second polycrystalline silicon film 37 and the first polycrystalline silicon film 33 in sequence while leaving portions 38a, 37a and 33a, respectively, thereby to form the polycrystalline region only at a predetermined location. Subsequently, with the silicon nitride film 38a being as a mask, silicon oxide films 39 are grown at the side faces of both the second polycrystalline silicon film 37a and the first polycrystalline silicon film 33a through thermal oxidation at high temperatures. Next, the silicon nitride film is removed to obtain the structure as shown in FIG. 4D. Next, a metal layer 34 such as platinum or titanium is coated all over the surface in a thickness of about 1000 Å, as shown in FIG. 4E. Next, appropriate heat treatment is conducted so that metal atom react with silicon atoms to grow a metal silicide layer 35 only in the region where the metal layer 34 is contiguous with the second polycrystalline silicon film 37a. The metal silicide layer 35 has a thickness in order of 2000 to 3000 Å. On this occasion, as previously noted with reference to the prior art, the metal silicide layer is not grown in the portion of the metal layer 34 on the silicon oxide films 32, 39 (FIG. 4F). Next, the nonreacted metal layer 34 is selectively etched as shown in FIG. 4G.

Features of this structure are in that the polycrystalline silicon layer has a double-film structure unlike the conventional structure, and that the first polycrystalline silicon film is formed to provide very high impurity concentration at the part near the insulating film 32, thereby making it avoidable to diffuse the metal silicide layer to approach near the insulating film 32.

What is claimed is:

1. A method of manufacturing a semiconductor device comprising the steps of forming an insulating film on a semiconductor substrate, forming a first polycrystalline silicon film on the surface of said insulating film, forming a second polycrystalline silicon film having a lower impurity concentration than said first polycrystalline silicon film on the surface of said first polycrystalline silicon film and less than $10^{21}$ cm$^{-3}$, patterning both said first and second polycrystalline silicon films into a predetermined shape, forming a metal film on said second polycrystalline silicon film and reacting said metal film and said second polycrystalline silicon film to form a metal silicide layer.

2. A method of manufacturing a semiconductor device of claim 1, wherein the impurity concentration of said first polycrystalline silicon layer is not less than $10^{21}$ cm$^{-3}$.

3. A method of manufacturing a semiconductor device of claim 1, wherein impurity concentration of said second polycrystalline silicon layer is not less than $10^{17}$ cm$^{-3}$.

* * * * *